US006876197B2

(12) United States Patent
Albrecht et al.

(10) Patent No.: US 6,876,197 B2
(45) Date of Patent: Apr. 5, 2005

(54) TRANSMISSION ARRANGEMENT FOR A MAGNETIC RESONANCE APPARATUS

(75) Inventors: Adam Albrecht, Nürnberg (DE); Horst Kröckel, Bamberg (DE); Wilfried Schnell, Forchheim (DE); Markus Vester, Nürnberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/903,643

(22) Filed: Jul. 30, 2004

(65) Prior Publication Data

US 2005/0035762 A1 Feb. 17, 2005

(30) Foreign Application Priority Data

Jul. 31, 2003 (DE) .......................................... 103 35 144

(51) Int. Cl.[7] .................................................. G01V 3/00
(52) U.S. Cl. ...................................... 324/307; 324/322
(58) Field of Search ................................ 324/301, 307, 324/309–316, 318, 322

(56) References Cited

U.S. PATENT DOCUMENTS 5,208,537 A * 5/1993 Rietsch et al. .............. 324/322
6,304,085 B2 10/2001 Kuth et al.
6,433,546 B1 8/2002 Kroeckel et al.

* cited by examiner

*Primary Examiner*—Bot LeDynh
(74) *Attorney, Agent, or Firm*—Schiff Hardin LLP

(57) ABSTRACT

In a transmission arrangement for a magnetic resonance apparatus, a high-frequency input signal, via an input terminal is supplied to a high-frequency power amplifier. The amplifier amplifiers the input signal with from a high-frequency output signal and supplies it to an antenna arrangement that emits it as a magnetic resonance excitation signal. Directional couplers are respectively connected between the input terminal and the amplifier and between the amplifier and the antenna arrangement. The acquired signals are supplied to an amplitude controller that drives an amplitude regulator preceding the high-frequency power amplifier.

19 Claims, 3 Drawing Sheets

TRANSMISSION ARRANGEMENT FOR A MAGNETIC RESONANCE APPARATUS

BACKGROUND OF THE INVENTION

1. Field of the Invention

The present invention is directed to a transmission arrangement for a magnetic resonance apparatus having an input terminal, a high-frequency power amplifier and an antenna arrangement, wherein the high-frequency input signal is amplified by the high-frequency power amplifier to produce a high-frequency output signal for supply to the antenna arrangement for emission therefrom as a magnetic resonance excitation signal.

2. Description of the Prior Art

German Patent. 199 11 975 C2 or German Patent. 100 04 423 C2 disclose such a transmission arrangement. The described transmission arrangements already operate in a satisfactory manner.

Pulse repetition accuracies of approximately 1% to 4% can be obtained by such known transmission arrangements.

SUMMARY OF THE INVENTION

An object of the present invention is to improve a transmission arrangement of the aforementioned type such that the pulse repetition accuracy is greater, without impairing the reliability of the operation of the transmission arrangement.

This object is achieved in accordance with the invention by a transmission arrangement of the above type, wherein a directional coupler at the input side is connected between the input terminal and the high-frequency power amplifier, a directional coupler at the output side is connected between the high-frequency power amplifier and the antenna arrangement and the signals acquired by the directional couplers are supplied to an amplitude controller that drives an amplitude regulator connected between the directional coupler at the input side and the high-frequency power amplifier.

The power is controlled in the aforementioned manner so that possible chronological variations of the amplifier, e.g. drift, can be regulated over the course of time.

An amplitude controller that exhibits an integrating function or that is fashioned as an integral controller, in particular, allows the regulation to proceed particularly accurately.

The transmission arrangement operates even more effectively in an embodiment wherein the signals acquired by the directional couplers are also supplied to a phase controller that drives a phase regulator that precedes or follows the amplitude regulator. The phase controller preferably has an integrating function the same as the amplitude controller. In particular, said phase controller can also be configured as an integral controller.

The amplitude controller exhibits a controller behavior that is independent of the amplitudes given the arrangement of logarithmic detectors between the directional couplers and the amplitude controller.

The control or regulation is particularly stable in an embodiment wherein a temperature control is allocated to the detectors. As an alternative or in addition, the detectors can be thermally coupled with one another and/or can be thermally decoupled from the high-frequency power amplifier.

Given the use of a high-frequency power amplifier having an expanding characteristic curve, a compressor preferably is connected between the input terminal and the high-frequency power amplifier. The compressor at least compensates the expanding characteristic curve of the high-frequency power amplifier over its entire dynamic range. As a result, the transmission arrangement can be operated in a more reliable manner. The compressor can exhibit a soft characteristic curve, and in particular can be fashioned as a diode limiter.

Preferably, the signal acquired by the directional coupler at the input side also is supplied to a comparator that disconnects the directional couplers from the amplitude regulator, and possibly from the phase regulator as well, when the signal acquired by the directional coupler at the input side downwardly transgresses a limit level. Then, the control loop is opened when a reliable control is not possible as a result of extremely low signals.

An improved transient behavior of the amplitude control, possibly also phase control, can be achieved by arranging a 90° hybrid having two inputs and outputs between the directional coupler at the output side and the antenna arrangement, said 90° hybrid dividing the high-frequency output signal into two sub-signals, by closing one of the inputs of the 90° hybrid with a terminating resistor, by supplying both sub-signals to the antenna arrangement and by having a homogenous response with respect to both sub-signals.

The antenna arrangement can have two antennas with the sub-signals being respectively supplied to the antennas, Each antenna emits a linearly polarized magnetic resonance excitation signal and the linearly polarized magnetic resonance excitation signals superimpose themselves to form to a circularly polarized magnetic resonance excitation signal. Another possibly is that the antenna arrangement has only a single antenna structure and this antenna structure emits a circularly polarized magnetic resonance excitation signal by the supply of both sub-signals thereto.

The transmission arrangement operates particularly fast and reliable when it is fashioned as a hardware circuit having analog components.

DESCRIPTION OF THE PREFERRED EMBODIMENTS

Figure 1:
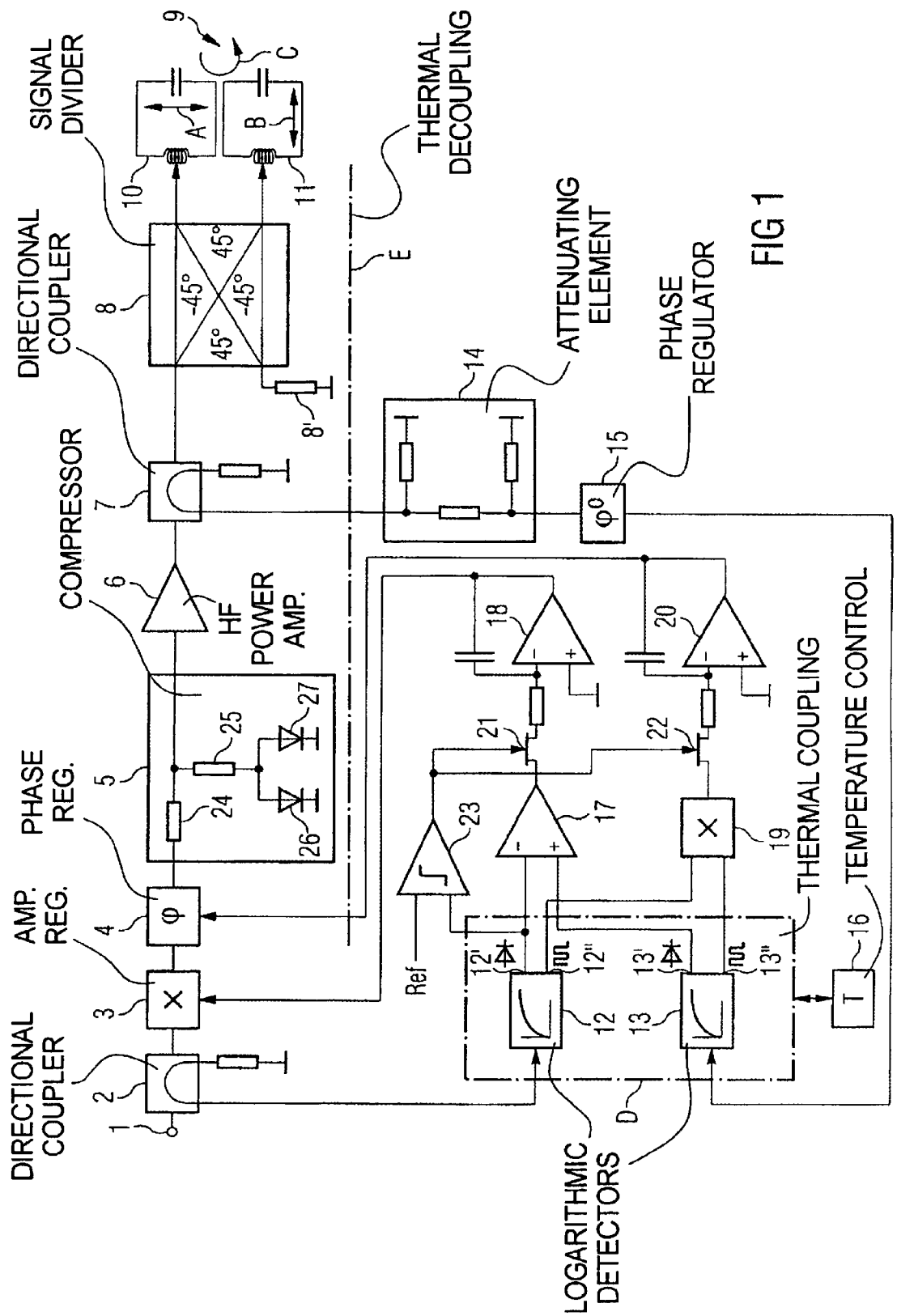
FIG. 1 is a block circuit diagram of a transmission arrangement for a magnetic resonance apparatus constructed and operating in accordance with the invention.

As shown in FIG. 1, the transmission arrangement has an input terminal 1. A high-frequency input signal can be supplied to the transmission arrangement via the input terminal 1.

A directional coupler 2 at the input side follows the input terminal 1. The directional coupler 2 at the input side detects a signal that corresponds to the high-frequency input signal allocated via the input terminal 1. Therefore, it corresponds to a high-frequency input reference signal.

An amplitude regulator 3 follows the directional coupler 2 at the input side. The amplitude regulator 3 carries out an amplitude adjustment with respect to the high-frequency input signal that is supplied to it, and the purpose which will be described in the following.

A phase regulator 4 follows the amplitude regulator 3. The phase regulator 4 carriers out a phase shift of the high-frequency input signal.

A compressor 5 follows the phase regulator 4. The compressor 5 compresses the signal supplied to it. The compressor 5 attenuates higher high-frequency signal levels whereas it does not or only slightly attenuates lower high-frequency signal levels.

A high-frequency power amplifier 6 follows the compressor 6. The high-frequency power amplifier 6 amplifiers the high-frequency input signal supplied to it and outputs the amplified high-frequency input signal as a high-frequency output signal.

The high-frequency power amplifier 6 is followed by a directional coupler 7 at the output side. The directional coupler 7 at the output side detects a signal that corresponds to the high-frequency output signal. Therefore, it corresponds to a high-frequency actual output signal.

The directional coupler 7 at the output side is followed by a signal divider 8 having a bandwidth of a number of MHz. The signal divider 8 is configured as a 90° hybrid having two inputs and two outputs. Its second input is closed by a terminating resistor 8'. It divides the high-frequency output signal into two sub-signals that have the same amplitudes among each other but are phase-shifted by 90° relative to one another.

An antenna arrangement 9 follows the signal divider 8. The signal divider 8 supplies both sub-signals to the antenna arrangement 9. As shown in FIG. 1, the antenna arrangement 9 has two equally configured antennas 10, 11. One of the sub-signals is respectively supplied to one of the antennas 10, 11.

The antennas 10, 11 each have the same bandwidth and the same coupling factor. Therefore, each antenna 10, 11 exhibits a homogenous frequency dependency of its reflection factors with respect to the sub-signal supplied to it and therefore exhibits homogenous transient reflections given the transient oscillation. As shown in FIG. 1 by the arrows A and B, the antennas 10, 11 produce linearly polarized magnetic resonance excitation signals that are emitted by the antennas 10, 11. Due to the phase shift of 90°, the two linearly polarized magnetic resonance excitation signals superimpose on each other with to form a circularly polarized magnetic resonance excitation signal (as indicated by the arrow C). to the extent that the transient reflections are reflected back to the amplifier output, they cancel each other since they are phase-shifted with respect to one another by 180° after the second pass through the hybrid 8. They are absorbed by the terminating resistor 8' if they are reflected to it.

The signals acquired by the directional couplers 2, 7 are supplied to logarithmic detectors 12, 13. Such detectors 12, 13 are generally known and are distributed by the company Analog Devices under the designation AD8302, for example. The signal acquired by the directional coupler 2 at the input side is directly supplied to the logarithmic detector 12. The signal acquired by the directional coupler 7 at the output side is supplied to the logarithmic detector 13 via an attenuating element 14 and a phase regulator 15.

As indicated by the outline D, the logarithmic detectors 12, 13 are thermally coupled with one another. The thermal coupling can be achieved, for example, by arranging both detectors 12, 13 on the same chip, as is the case for the aforementioned AD8302. As an alternative or in addition, the detectors 12, 13 (as indicated in FIG. 1 by a dot-dash line E) are thermally decoupled from the high-frequency power amplifier 6. This can be achieved, for example, by arranging the detectors 12, 13 on a different printed circuit board from the high-frequency power amplifier 6. Furthermore, it is possible to allocate a temperature control 16 to the detectors 12, 13. All of the above measures support each other so that the detectors 12, 13 can be operated such that potential differences in the characteristic curves of the detectors 12, 13 are not time-variable.

Among other things, the detectors 12, 13 carry out a rectification of the signals supplied to them (as indicated by the rectifier symbols) and therefore perform a demodulation. The modulation signals, which are produced in this manner has a relatively low frequency and are emitted by the detectors 12, 13 at the outputs 12', 13' and are supplied from there to a difference former 17 which forwards the formed difference signal to an amplitude controller 18. Subsequently, the amplitude controller 18 correspondingly drives the amplitude regulator 3 so that the high-frequency output signal optimally corresponds to its reference value.

As shown in FIG. 1, the amplitude controller 18 is configured as an integral controller 18. It can additionally have a proportional stage and/or differential stage. The integral stage, however, should always be present.

The high-frequency signals supplied to the detectors 12, 13 also are supplied to limiters detector internally in order to generate sign functions. At the outputs 12", 13", the detectors 12, 13 emit the sign functions, which are subsequently supplied to a phase detector 19. The output signal of the phase detector 19 is supplied to a phase controller 20 that, in turn, tracks the phase regulator 4.

As shown in FIG. 1, the phase controller 20 is also configured as an internal controller 20. As it is the case for the amplitude controller 18, a proportional portion and/or differential stage also can be present, but the integral stage should always be present as well.

Given low high-frequency input signals, the tracking of the amplitude regulator 3 and the phase regulator 4 is associated with significant uncertainties. Therefore, disconnection (interrupt) elements 21, 22 are connected between the difference former 17 and the phase detector 19 at one side and between the controllers 18, 20 at the other side (see FIG. 1). In the exemplary embodiment, the disconnection elements 21, 22 are fashioned as MOSFETs.

The disconnection elements 21, 22 are operated by a comparator 23, with the demodulated signal acquired by the directional coupler 2 at the input side being supplied to one input of the comparator 23 from the detector 12, and a limit signal being supplied to the other input. Therefore, the comparator 23 decouples the amplitude regulator 3 and the phase regulator 4 from the directional couplers 2, 7 when the signal detected by the directional coupler 2 at the input side downwardly transgresses the limit level.

As a result of this decoupling, the amplitude regulator 3 and the phase regulator 4 are no longer tracking when the high-frequency input signal exhibits amplitudes that are too low.

Figure 2:
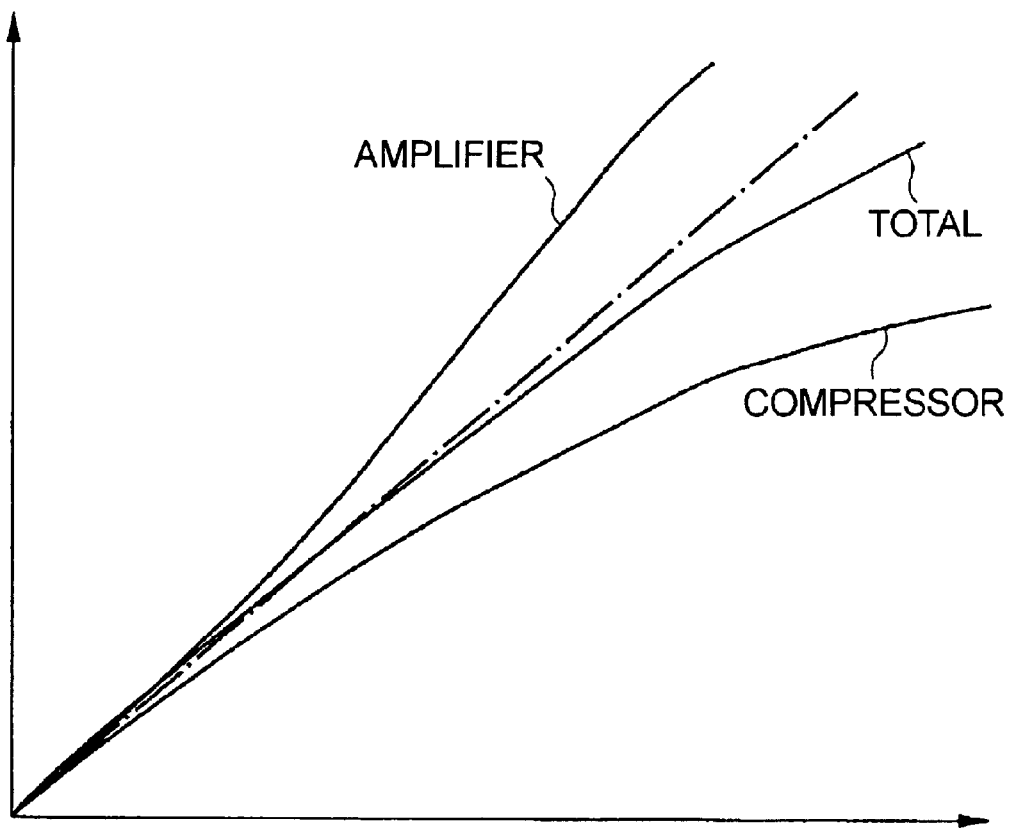
FIG. 2 shows a characteristic curve diagram for the high-frequency power amplifier in the arrangement of FIG. 1.

The high-frequency power amplifier 6 can exhibit an expanding characteristics curve (see FIG. 2). It is also possible for the high-frequency power amplifier 6 to amplify stronger input signals more than weaker input signals. The compressor 5 is designed such that it exhibits a compressing characteristic curve (also see FIG. 2). The compressor 5 at least compensates (as indicated by the linear dot-dash curve in FIG. 2) and possibly even overcompensates (as indicated by the curve designated "total" in FIG. 2) the expanding characteristic curve of the high-frequency power amplifier 6 in its entire dynamic range. In this way, transient overdriving of the amplifier 6 can be avoided. Otherwise, such overdriving could occur particularly during the transient time of the control after sudden amplitude jumps.

The compressor 5 can be formed by resistors 24, 25 and diodes 26, 27, for example. Therefore, it can be fashioned as a diode limiter. Due to the presence of the resistor 25, the compressor has a soft characteristic curve.

Figure 3:
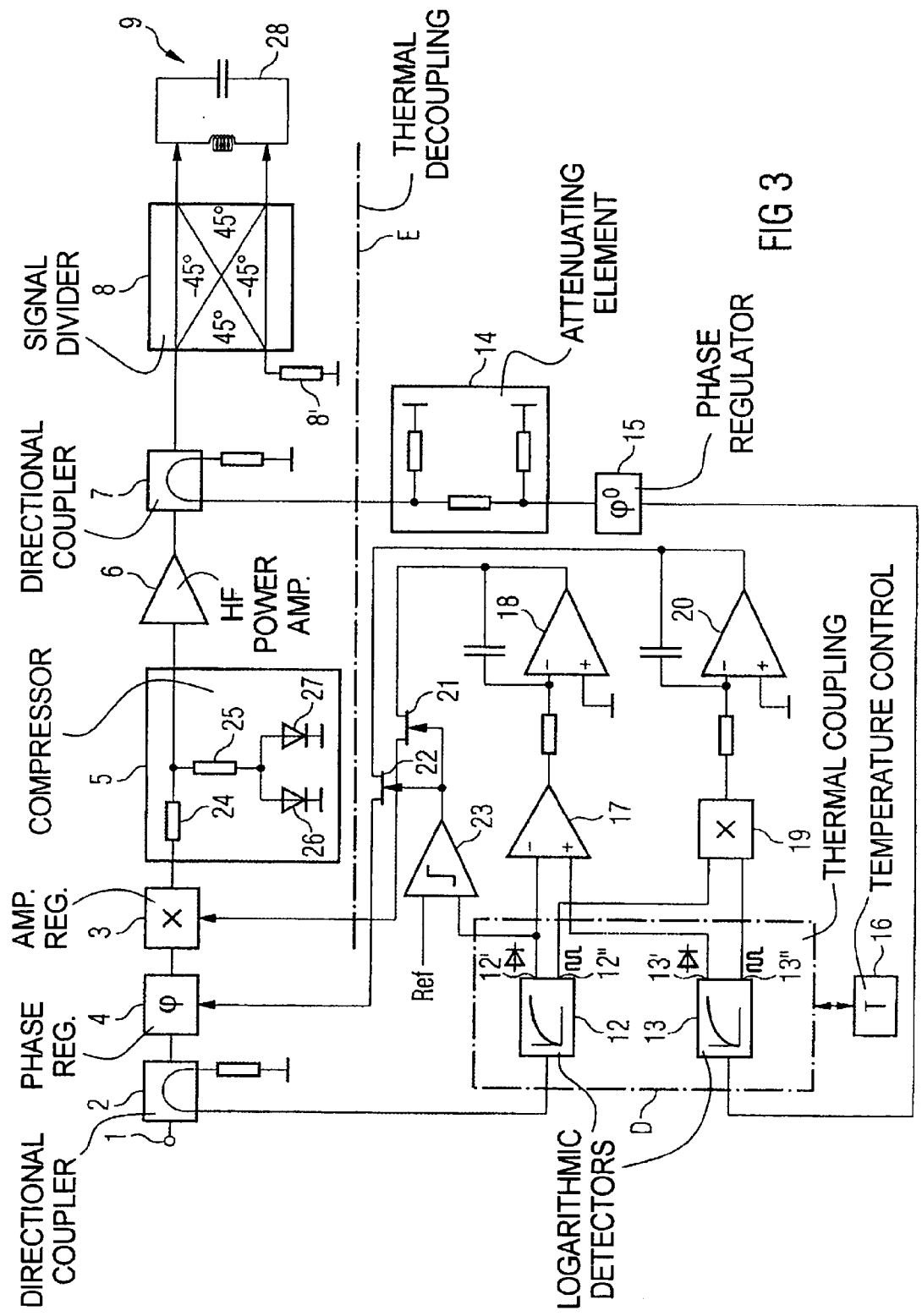
FIG. 3 shows a modification of the transmission arrangement of FIG. 1.

FIG. 3 essentially corresponds to FIG. 1, with the differences explained below. Therefore, the above explanations regarding FIG. 1 are also valid for FIG. 3 with regard to the basic principles of operation.

As shown in FIG. 3, the phase regulator 4 does not follow the amplitude regulator 3, but precedes it.

Furthermore, the antenna arrangement 9 has a single antenna structure 28, such as a birdcage resonator. Both sub-signals are supplied to this antenna structure. Therefore, the antenna structure 28 directly emits a circularly polarized magnetic resonance excitation signal. The antenna structure 28 also exhibits a homogenous response with respect to both sub-signals.

As also shown in FIG. 3, the limiting elements 21, 22 do no precede the controllers 18, 20, but follow them. Given disconnection of the directional couplers 2, 7 from the regulators 3, 4, these regulators assume preset (default) values. These predetermined values preferably correspond to the output values prescribed by the controllers 18, 20 given transition to the regulator operation.

The transmission arrangements of FIGS. 1 and 3 are fashioned as hardware circuits having analog components. As a result, the inventive transmission arrangement can be easily produced, is composed of inexpensive parts, and functions in a fast and reliable manner.

Although modifications and changes may be suggested by those skilled in the art, it is the intention of the inventors to embody within the patent warranted hereon all changes and modifications as reasonably and properly come within the scope of their contribution to the art.

We claim as our invention:

1. A transmission arrangement for a magnetic resonance apparatus comprising:

an input terminal adapted to receive a high-frequency input signal;

a high-frequency power amplifier for amplifying said high-frequency input signal to produce a high-frequency output signal;

an antenna arrangement to which said high-frequency output signal is supplied for emitting said high-frequency output signal as a magnetic resonance excitation signal;

a first directional coupler connected between said input terminal and said high-frequency power amplifier;

a second directional coupler connected between said high-frequency power amplifier and said antenna arrangement;

an amplitude regulator connected between said second directional coupler and said high-frequency power amplifier; and an amplitude controller, supplied with signals respectively detected by said first and second direction couplers, and connected to said amplitude regulator for regulating an amplitude of an input signal to said high-frequency power amplifier.

2. A transmission arrangement as claimed in claim 1 wherein said amplitude controller contains an integrating stage.

3. A transmission arrangement as claimed in claim 1 wherein said amplitude controller is an integral controller.

4. A transmission arrangement as claimed in claim 1 comprising a phase regulator also connected between said first directional coupler and said high-frequency power amplifier in series with said amplitude regulator, and a phase controller supplied with said signals respectively acquired by said first and second directional couplers for driving said phase regulator for regulating a phase of said input signal to said high-frequency power amplifier.

5. A transmission arrangement as claimed in claim 4 wherein said phase controller has an integral stage.

6. A transmission arrangement as claimed in claim 4 wherein said phase controller is an integral controller.

7. A transmission arrangement as claimed in claim 1 further comprising a first logarithmic detector connected betweens said first directional coupler and said amplitude controller, and a second logarithmic detector connected between said second directional coupler and said amplitude controller.

8. A transmission arrangement as claimed in claim 7 comprising a temperature control thermally interacting with said first and second logarithmic detectors for controlling a temperature of said first and second logarithmic detectors.

9. A transmission arrangement as claimed in claim 8 wherein said first and second logarithmic detectors are thermally coupled with each other.

10. A transmission arrangement as claimed in claim 8 wherein said first and second logarithmic detectors are thermally decoupled from said high-frequency power amplifier.

11. A transmission arrangement as claimed in claim 1 wherein said high-frequency power amplifier exhibits an expanding characteristic curve, and comprising a compressor connected between said input terminal and said high-frequency power amplifier for compensating said expanding characteristic curve of said high-frequency power amplifier over an entire dynamic operating range of said high-frequency power amplifier.

12. A transmission arrangement as claimed in claim 11 wherein said compressor exhibits a soft characteristic curve.

13. A transmission arrangement as claimed in claim 11 wherein said compressor comprises a diode limiter.

14. A transmission arrangement as claimed in claim 1 comprising a comparator connected between said first directional coupler and said amplitude controller, and a disconnection element connected between each of said first and second directional couplers and said amplitude controller, said comparator controlling said disconnection element for disconnecting said first and second directional couplers from said amplitude controller when said signal acquired by said first directional coupler falls below a limit level.

15. A transmission arrangement as claimed in claim 1 comprising a phase regulator also connected between said first directional coupler and said high-frequency power amplifier in series with said amplitude regulator, and a phase controller supplied with said signals respectively acquired by said first and second directional couplers for driving said phase regulator for regulating a phase of said input signal to said high-frequency power amplifier, and a further disconnection element connected between said first and second directional couplers and said phase controller, said comparator controlling said further disconnection element for also disconnecting said first and second directional couplers from said phase controller if said signal acquired by said first directional coupler falls below said limit level.

16. A transmission arrangement as claimed in claim 1 comprising:

a 90° hybrid two inputs and two outputs connected between said second directional coupler and said antenna arrangement for dividing said high-frequency output signal into two sub-signals;

a terminating resistor connected to one of said two inputs of said 90° hybrid for closing said one of said two inputs; and said antenna arrangement being connected to said two outputs and being supplied with said two sub-signals, said antenna arrangement exhibiting a homogenous response with respect to both of said two sub-signals.

17. A transmission arrangement as claimed in claim 16 wherein said antenna arrangement comprises two antennas respectively supplied with said sub-signals, one sub-signal per antenna, each of said antennas emitting a linearly polarized magnetic resonance excitation signal and the respective linearly polarized magnetic resonance excitation signals superimposing on each other to form a circularly polarized magnetic resonance excitation signal.

18. A transmission arrangement as claimed in claim 16 wherein said antenna arrangement comprises a single antenna structure for directly emitting a circularly polarized magnetic resonance excitation signal from said two sub-signals.

19. A transmission arrangement as claimed in claim 1 wherein said first and second directional couplers, said high-frequency power amplifier, said amplitude regulator and said amplitude controller comprise analog components connected in a hardware circuit.

* * * * *